US010050619B1

(12) United States Patent
Sjoroos et al.

(10) Patent No.: US 10,050,619 B1
(45) Date of Patent: Aug. 14, 2018

(54) FEEDBACK CONTROLLER FOR RESONANT GATE DRIVE (71) Applicant: ABB Schweiz AG, Baden (CH)

(72) Inventors: Jukka-Pekka Sjoroos, Espoo (FI); Kari Tikkanen, New Berlin, WI (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/433,209

(22) Filed: Feb. 15, 2017

(51) Int. Cl.
H03K 17/56 (2006.01)
H03K 17/567 (2006.01)
H03K 17/691 (2006.01)
H03K 19/177 (2006.01)

(52) U.S. Cl.
CPC ......... H03K 17/567 (2013.01); H03K 17/691 (2013.01); H03K 19/17708 (2013.01)

(58) Field of Classification Search
CPC ............... H03K 17/567; H03K 17/691; H03K 19/17708
USPC .......................... 327/108, 109, 110, 111, 112
See application file for complete search history.

(56) References Cited

U.S. PATENT DOCUMENTS 7,459,945 B2 * 12/2008 Omura ............. H03K 17/04123 327/108
8,847,631 B2 9/2014 Tao et al.
2011/0101951 A1 * 5/2011 Zhang ............... H02M 3/33592 323/305

OTHER PUBLICATIONS

Knecht, Martin, Datasheet Technical Information FS450R17KE3 Infineon Technologies, Feb. 10, 2013, 8 pgs.
Knecht, Martin, Datasheet Technical Information FS225R12KE3 Infineon Technologies, Feb. 10, 2013, 8 pgs.
Eberle, Wilson et al., "A New Resonant Gate-Drive Circuit With Efficient Energy Recovery and Low Conduction Loss", IEEE Transactions on Industrial Electronics, vol. 55, No. 5, May 2008, pp. 2213-2221.
De Vries, Ian D., "A Resonant Power Mosfet/IGBT Gate Driver", IEEE 2002, pp. 179-185.
Fujita, Hideaki, "A Resonant Gate-Drive Circuit Capable of High-Frequency and High-Efficiency Operation", IEEE Transactions of PowerElectronics, vol. 25, No. 4, Apr. 2010, pp. 962-969.

* cited by examiner

Primary Examiner — John Poos
(74) Attorney, Agent, or Firm — J. Bruce Schelkopf; Taft Stettinius & Hollister LLP (57) ABSTRACT Unique systems, methods, techniques and apparatuses of a gate driver are disclosed herein. One exemplary embodiment is a gate driver comprising a first and second DC rail, a first converter arm including a first and second semiconductor device, a second converter arm including a third and fourth semiconductor device, an inductor, and a controller. The controller is configured to open and close the primary switching device by operating the semiconductor devices so as to transmit power between the gate driver and a gate of a primary switching device. The controller is configured to transmit a gate signal to the primary switching device by closing the second semiconductor device, then opening the second semiconductor device and closing the fourth semiconductor device in response to the gate of the primary switching device receiving power with a voltage greater than or equal in magnitude to the voltage of the second DC rail.

19 Claims, 6 Drawing Sheets

FEEDBACK CONTROLLER FOR RESONANT GATE DRIVE

BACKGROUND

The present disclosure relates generally to a gate driver. A semiconductor switch is opened and closed by transmitting a gate signal from a gate driver to the gate of the semiconductor switch. To close the semiconductor switch, DC power with a positive voltage from a DC power supply is applied to the gate of the semiconductor switch. To open the semiconductor switch, DC power with a negative voltage may be applied to the gate of the semiconductor switch. DC power not returned to the DC power supply is discharged within the gate driver, often using a resistive element. Existing gate drivers suffer from a number of shortcomings and disadvantages. There remain unmet needs including reduced power losses, reduced gate driver size, and increased gate driver reliability. For instance, the discharged DC power generates heat, requiring a heat sink large enough to regulate the temperature of the gate drive circuit. As the frequency of the gate signal increases, the power losses of the gate driver increase and therefore the size of the heat sink must be increased. There is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY

Exemplary embodiments include unique systems, methods, techniques and apparatuses for a gate driver. Further embodiments, forms, objects, features, advantages, aspects and benefits of the disclosure shall become apparent from the following description and drawings.

BRIEF DESCRIPTION OF THE DRAWINGS

FIGS. 5A-7 are graphs illustrating operation of the gate driver of FIG. 1.

DETAILED DESCRIPTION OF ILLUSTRATIVE EMBODIMENTS

Figure 1:
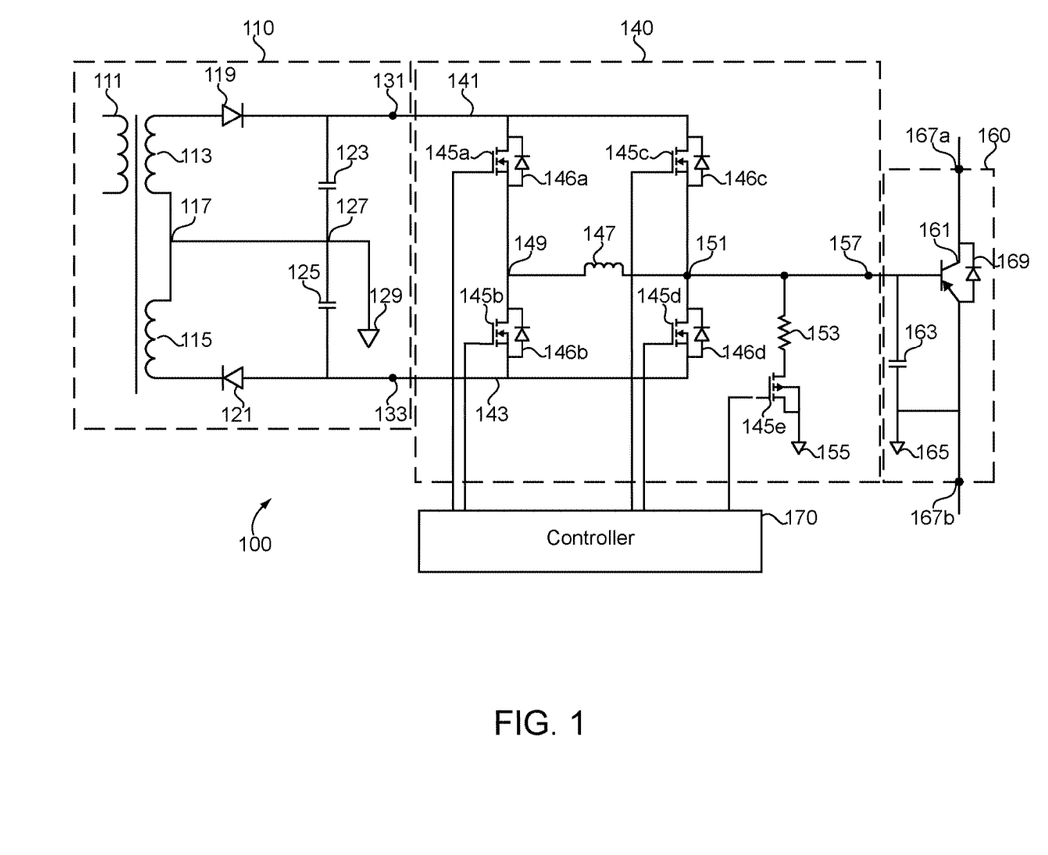
FIG. 1 illustrates an exemplary gate driver.

With reference to FIG. 1 there is illustrated gate driver system 100 coupled to a primary switch, insulated-gate bipolar transistor (IGBT) 160. It shall be appreciated that gate driver system 100 may be implemented to drive other switches, such as metal oxide semiconductor field effect transistors (MOSFETs) or other types of semiconductor switches.

System 100 includes a DC power supply circuit 110 structured to receive AC power, convert the AC power to DC power, and output the converted DC power. Circuit 110 includes a transformer including a primary winding 111 structured to receive AC power from an AC power source, and two series coupled secondary windings 113, 115 electrically coupled to winding 111 and structured to receive AC power from winding 111. In certain embodiments, windings 113 and 115 are structured to step up or step down the voltage of the AC power received with winding 111. Secondary windings 113 and 115 are coupled at a midpoint connection 117.

Power supply circuit 110 includes a diode 119 coupled to winding 113 and a diode 121 coupled to winding 115. Diode 119 and diode 121 are structured to receive AC power from secondary windings 113 and 115, and convert the AC power to DC power. Two smoothing capacitors 123, 125 are coupled in parallel to secondary windings 113, 115 and coupled together in series at a midpoint connection 127. A positive output terminus 131 is coupled to capacitor 123 and a negative output terminus 133 is coupled to capacitor 125. Midpoint connection 127 is coupled to midpoint connection 117 and a ground 129. In certain embodiments, the voltage at positive output terminus 131 is 15V and the voltage at negative output terminus 133 is −15V. In other embodiments, system 100 does not include DC power supply circuit 110 and system 100 is structured to receive DC power.

System 100 includes a driving circuit 140 coupled to DC power supply circuit 110 and structured to receive DC power from circuit 110 and output a gate signal to IGBT 160. Driving circuit 140 includes a positive DC rail 141 coupled to positive output terminus 131 of power supply circuit 110 and a negative DC rail 143 coupled to negative output terminus 133 of power supply circuit 110. Driving circuit 140 includes two converter legs coupled between rail 141 and rail 143. One converter leg includes semiconductor switch 145a and semiconductor switch 145b. Switch 145a includes a first terminus coupled to positive DC rail 141 and a second terminus coupled to a midpoint connection 149. Switch 145a is coupled in an anti-parallel configuration with a freewheeling diode 146a. In the illustrated embodiment, switch 145a is a MOSFET. In other embodiments, switch 145a may include one or more bipolar junction transistors (BJT), IGBT, gate turn-off thyristors (GTO), MOS-controlled thyristors (MCT), integrated gate-commutated thyristors (IGCT), silicon carbide (SiC) switching device, gallium nitride (GaN) switching device, or any other type of switch structured to selectively control the flow of electric current. It shall be appreciated that any or all of the foregoing features of switch 145a may also be present in the other switches disclosed herein.

Switch 145b includes a first terminus coupled to midpoint connection 149 and a second terminus coupled to negative DC rail 143. Switch 145b is coupled in an anti-parallel configuration with a freewheeling diode 146b.

The second converter leg of the driving circuit 140 includes semiconductor switch 145c and semiconductor switch 145d. Switch 145c is coupled in an anti-parallel configuration with a freewheeling diode 146c and switch 145d is coupled in an anti-parallel configuration with a freewheeling diode 146d. Switch 145c includes a first terminus coupled to positive DC rail 141 and a second terminus coupled to a midpoint connection 151. Switch 145d includes a first terminus coupled to midpoint connection 151 and a second terminus coupled to negative DC rail 143.

Driving circuit 140 includes an inductor 147 coupled between midpoint connection 149 and midpoint connection 151. In certain embodiments, inductor 147 includes multiple inductors coupled between midpoint connection 149 and midpoint connection 151. Inductor 147 may be sized based on the required IGBT gate charge and IGBT switching frequency. In certain embodiments, inductor 147 may be a coreless PCB inductor.

Driving circuit 140 includes a resistor 153 and semiconductor switch 145e coupled in parallel between midpoint connection 151 and a ground 155. A driving circuit output terminus 157 is coupled to midpoint connection 151.

System 100 is coupled to IGBT 160 by way of output terminus 157. IGBT 160 includes a transistor 161. The gate of transistor 161 is coupled to terminus 157, the source of transistor 161 is coupled to output terminus 167a, and the drain of transistor 161 is coupled to output terminus 167b. In certain embodiments, terminus 167b is coupled to ground 165. Transistor 161 is coupled in an anti-parallel configuration with a freewheeling diode 169. A capacitor 163 is coupled between the gate of transistor 161 and a ground 165. In other embodiments, IGBT 160 includes a gate resistor.

System 100 includes a controller 170 coupled to semiconductor switches 145a-145e. Controller 170 is configured to operate switches 145a-145e so as to receive DC power from DC power supply circuit 110, generate a gate signal using the received DC power, and return DC power to DC power supply circuit 110. As explained in more detail below, controller 170 turns on switches 145a and 145b in response to a modulating signal and turns off switches 145a and 145b based on a feedback signal generated by comparing the voltages of the DC rails 141, 143 to the voltage at the gate of transistor 161. Controller 170 operates switches 145c and 145d so as to clamp the voltage at the gate of transistor 161.

Controller 170 operates semiconductor switch 145e so as to reduce gate signal change in current and voltage overshoot. When controller 170 detects a short circuit, either by measuring saturation voltage feedback or high bandwidth current, controller 170 closes semiconductor switch 145e, increasing the gate impedance. In another embodiment, driving circuit 140 does not include semiconductor switch 145e, ground 155, or resistor 153.

Figure 2:
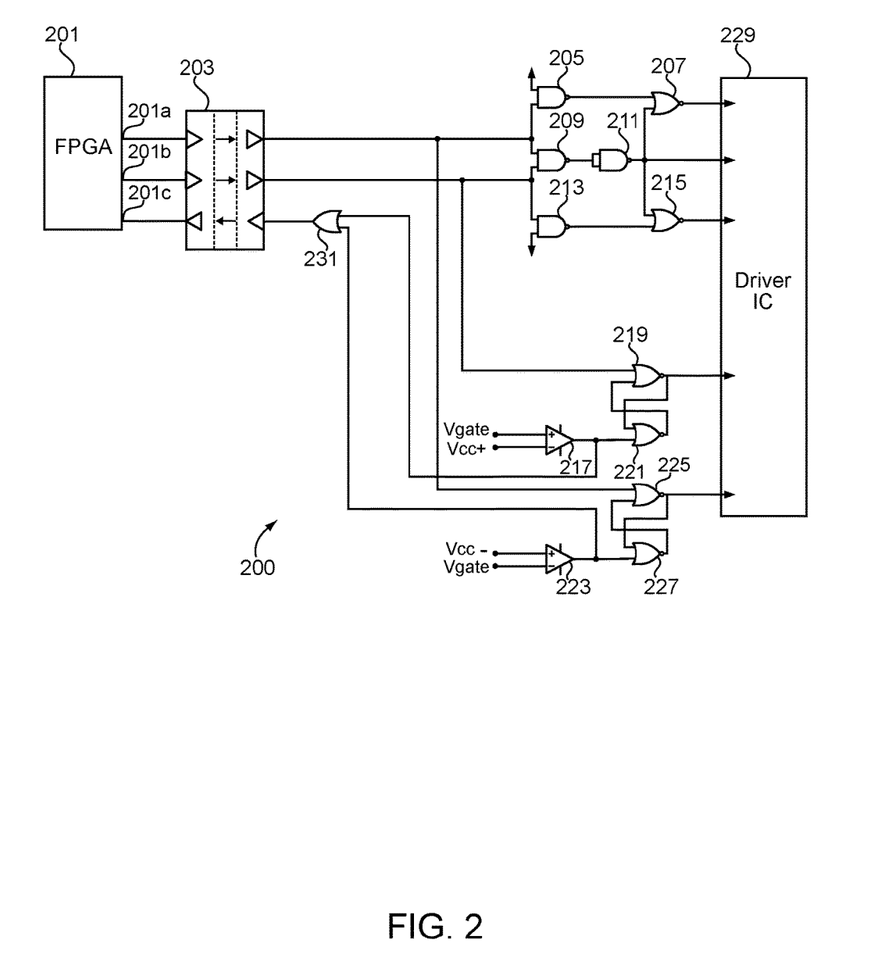
FIG. 2 illustrates an exemplary controller for the gate driver of FIG. 1.

With reference to FIG. 2 there is illustrated an exemplary controller 200, such as controller 170 of system 100 in FIG. 1. Controller 200 includes a field-programmable gate array (FPGA) 201 coupled to a digital isolator 203. FPGA 201 is structured to receive a modulating signal, such as a flux space vector. The modulating signal is configured to control the duty cycle of IGBT 160 and may be generated by a digital signal processor. FPGA 201 is also structured to receive one feedback signal at port 201c. FPGA 201 is structured to transmit two output signals, the first FPGA signal from port 201a and the second FPGA signal from port 201b. FPGA 201 generates the first and second FPGA signal using the modulating signal and the feedback signal.

Controller 200 includes a plurality of digital logic circuit components including logic gates and comparators structured to receive the two FPGA signals from FPGA 201 and output one signal for each semiconductor switch of circuit 140 to a driver integrated circuit 229. The logic circuit components include NAND gates, NOR gates, an OR gate, and comparators. Logic gates are structured to receive two one-bit input signals. A NAND gate outputs a low signal if both input signals are high signals. For all other input combinations, the NAND gate outputs a high signal. A NOR gate outputs a low signal if one or both input signals are a high signal. If both input signals are low signals, the NOR gate outputs a high signal. An OR gate outputs a high signal if at least one input signal is a high signal.

The first FPGA signal is transmitted from port 201a of FPGA 201 to NAND gate 205, NAND gate 209, and NOR gate 225. The second FPGA signal is transmitted from port 201b of FPGA 201 to NAND gate 209, NAND gate 213, and NOR gate 219. The output of NAND gate 209 is received with NAND gate 211. The outputs of NAND gate 205 and NAND gate 211 are received by NOR gate 207. The outputs of NAND gate 211 and NAND gate 213 are received with NOR gate 215. The outputs of NOR gate 207, NAND gate 211, and NOR gate 215 are transmitted to driver integrated circuit 229.

Controller 200 includes a positive comparator 217 and a negative comparator 223. Positive comparator 217 is structured to receive one input signal corresponding to the voltage of positive DC rail 141 and another input signal corresponding to the voltage of the gate of transistor 161. If the positive voltage of the gate is higher than or equal to the voltage of rail 141, comparator 217 outputs a high signal. Otherwise, comparator 217 outputs a low signal. Negative comparator 223 is structured to receive one input signal corresponding to the voltage negative DC rail 143 and another input signal corresponding to the voltage of the gate of transistor 161. If the negative voltage of the gate is greater than or equal in magnitude to the voltage of the DC rail 143, comparator 223 outputs a high signal. Otherwise, comparator 223 outputs a low signal. The output of comparator 217 is transmitted to OR gate 231 and NOR gate 221. The output of NOR gate 219 is transmitted to driver integrated circuit 229 and NOR 221. The output of NOR gate 221 is transmitted to NOR gate 219.

The output of comparator 223 is transmitted to NOR gate 227 and OR gate 231. The output of NOR gate 227 is transmitted to NOR gate 225. The output of NOR gate 225 is transmitted to driver integrated circuit 229 and NOR gate 227. The output of OR gate 231 is transmitted to port 201c by way of digital isolator 203.

Driver integrated circuit 229 is configured to operate switch 145a using the output of NOR gate 207, to operate switch 145e using the output of NAND gate 211, and to operate switch 145b using the output of NOR gate 215. Circuit 229 is also configured to operate switch 145c using the output of NOR gate 219 and to operate switch 145d using the output of NOR gate 225.

Figure 3:
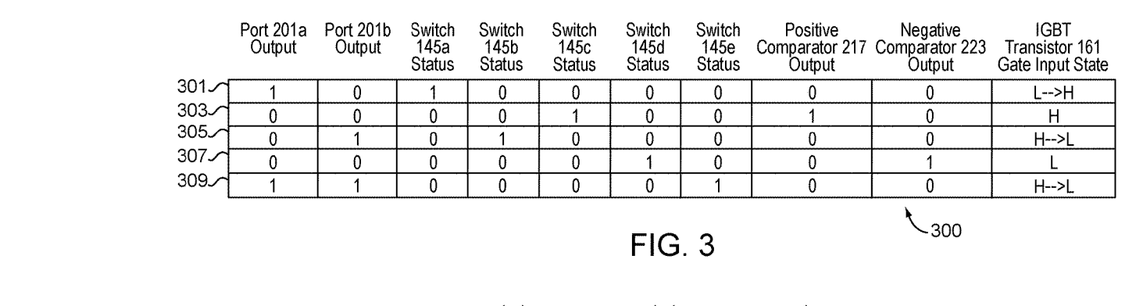
FIG. 3 is a table illustrating the operation of switches of the gate driver of FIG. 1.

With reference to FIG. 3 there is a table 300 illustrating five states of controller 200 in FIG. 2. Cells of table 300 with a '1' indicate a high signal and cells with a '0' indicate a low signal.

Row 301 describes the first state in which the first FPGA signal is high and the second FPGA signal is low. In response to the first and second control signal, controller 200 generates a high control signal for switch 145a and low control signals for switches 145b-e. Positive comparator 217 and negative comparator 223 generate low feedback signals. As a result of the high first FPGA signal and the low second FPGA signal, the gate signal received with the IGBT transistor 161 transitions from a low signal to a high signal.

Controller 200 transitions from the first state to a second state described in row 303 in response to the voltage of the gate signal being greater than or equal to the voltage of positive DC rail 141. The first FPGA signal and the second FPGA signal are low signals. Positive comparator 217 feedback signal is a high signal and negative comparator 223 feedback signal is a low signal. In response to the FPGA signals and the feedback signal, controller 200 turns on switch 145c with a high signal and turns off switches 145a-b and 145d-e with a low signal. The operation of switches 145a-e causes the voltage of the gate signal received with IGBT transistor 161 to be clamped high.

Controller 200 transitions from the second state to a third state described in row 305 in response to the modulating signal received with FPGA 201. The first FPGA signal is a low signal and the second FPGA signal is a high signal. The positive comparator 217 output signal and negative comparator 223 output signal are low signals. In response to the FPGA signals, controller 200 transmits a high signal to switch 145b and low control signals to switches 145a and 145c-e. The operation of switches 145a-e causes the voltage of the gate signal received with IGBT transistor 161 to transition from high to low.

Controller 200 transitions from the third state to a fourth state described in row 307 in response to the voltage of the gate signal being greater than or equal in magnitude to the voltage of negative DC rail 143. The first FPGA signal and the second FPGA signal are low signals. The positive comparator 217 output signal is a low signal and the negative comparator 223 output signal is a high signal. FPGA 201 generates the first and second FPGA signals using the comparator output signals and the modulating signal. In response to the FPGA signals, controller 200 transmits a high signal to switch 145d and low signals to switches 145a-c and 145e. The operation of switches 145a-e causes the gate signal received with IGBT transistor 161 to remain low.

During the third state, controller 200 may determine a change in gate signal current or voltage overshoot should be reduced. In response, controller 200 enters a fifth stage in which the first FPGA signal and the second FPGA signal are high. In response, controller 200 transmits low signals for switches 145a-d. Controller 200 transmits a high signal to switch 145e. The operation of switch 145e causes the gate signal received with IGBT transistor 161 to transition from high to low at a rate slower than the transition from high to low during the third state.

Figure 4:
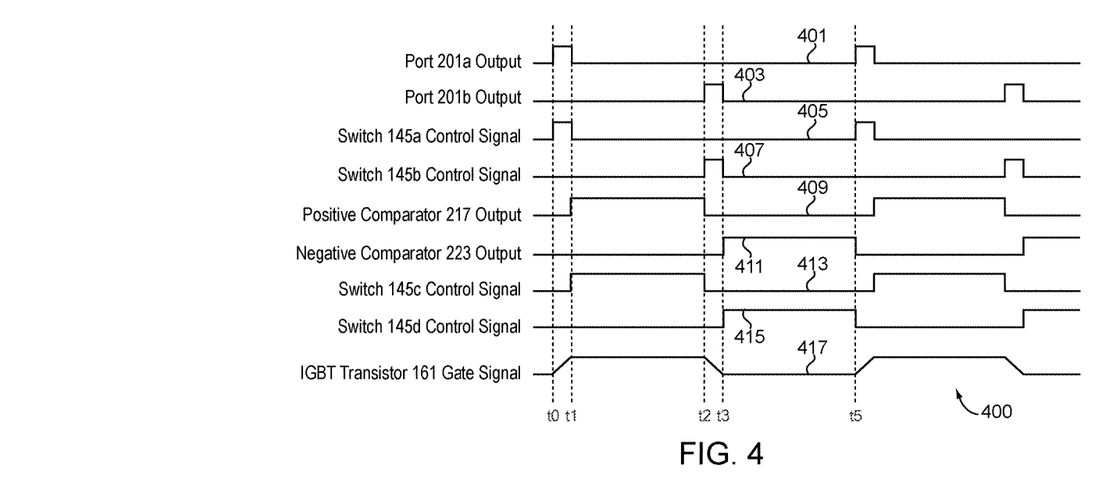
FIG. 4 is a timing diagram illustrating the operation of switches of the gate driver of FIG. 1.

With reference to FIG. 4 there is a timing diagram 400 illustrating the operation of an exemplary controller, such as controller 170 of FIG. 1 or controller 200 of FIG. 2, during a duty cycle of IGBT 160 including times t0-t4. Diagram 400 includes a line 401 representing the first FPGA signal, output by port 201a; a line 403 representing the second FPGA signal, output by port 201b; a line 405 representing the control signal received by switch 145a; a line 407 representing the control signal received by switch 145b; a line 409 representing the output of positive comparator 217; a line 411 representing the output of negative comparator 223; a line representing the control signal received by switch 145c; a line 415 representing the control signal received with switch 145d; and a line 417 representing the gate signal received by IGBT transistor 161.

The period between t0 and t1 illustrates operation of controller 200 during a primary switch off-on transition event. As shown by line 417, gate voltage rises from −15V to +15V. At time t1, gate voltage exceeds the positive voltage of the power supply, so the comparator 217 toggles from a low signal to a high signal. In response to the high signal from comparator 217, FPGA 201 outputs FPGA signals so as to turn off switch 145a. The period between t1 and t2 illustrates operation of controller 200 while IGBT 160 is turned on. Power is returned to the DC power supply circuit 110 by way of diodes 146b and 146c. The period between t2 and t3 illustrates operation of controller 200 during a primary switch on-off transition event. In certain embodiments, controller 200 may turn on switch 145e. At time t3, gate voltage exceeds the negative voltage of the power supply, so comparator 223 toggles from a low signal to a high signal. The period between t3 and t4 illustrates operation of controller 200 while IGBT is turned off. Power is returned to the DC power supply circuit 110 by way of diodes 146a and 146d. Switch 145d is turned on to clamp the gate voltage to the negative DC rail 143 to prevent high output impedance.

With reference to FIGS. 5A-5E there is a plurality of graphs illustrating electrical characteristics of an exemplary gate driver system, such as gate driver system 100, while turning on the primary switch. Each of the plurality of graphs depicts a period of time between zero and four microseconds. At zero seconds, the process of turning on the primary switch begins. At two microseconds, controller 170 responds to determining the magnitude of the positive gate voltage exceeds the magnitude of the positive voltage of rail 141 by turning off switch 145a and turning on switch 145c.

Figure 5A:
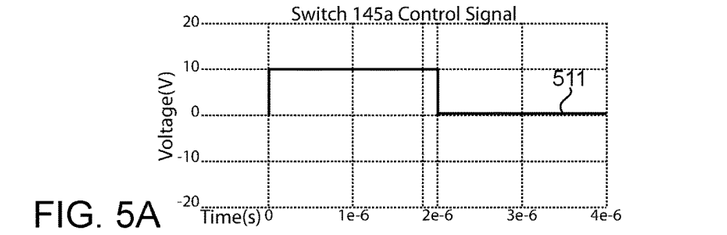
Figure 5B:
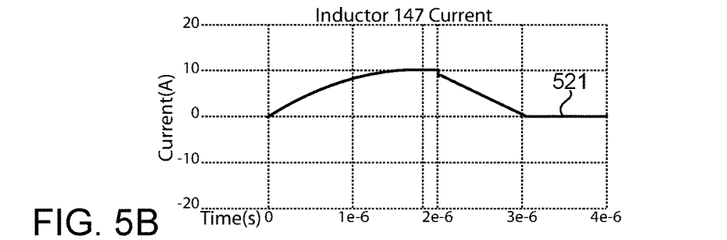
Figure 5C:
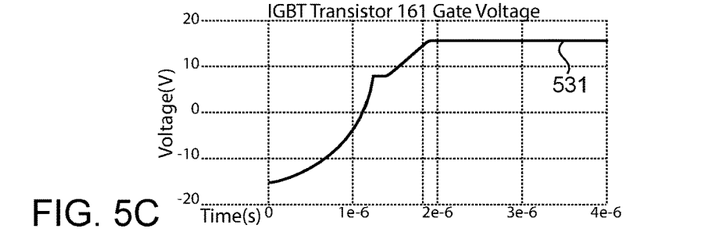
Figure 5D:
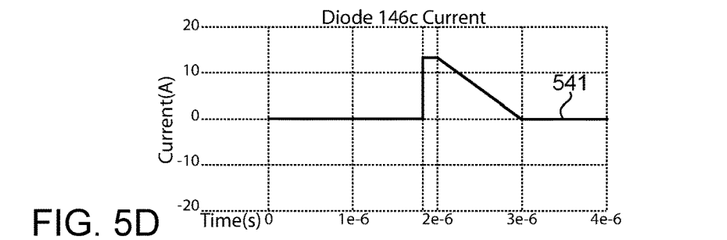
Figure 5E:
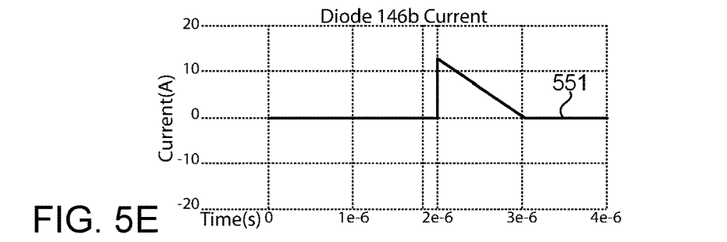

FIG. 5A is a graph including a line 511 representing a control signal transmitted from controller 170 to switch 145a. Switch 145a is closed from zero seconds to two microseconds in response to the control signal. FIG. 5B is a graph including a line 521 representing current flowing through inductor 147. FIG. 5C is a graph including a line 531 representing the voltage at the gate of IGBT transistor 161. FIG. 5D is a graph including a line 541 representing current flowing through diode 146c. FIG. 5E is a graph including a line 551 representing current flowing through diode 146b.

With reference to FIGS. 6A-6E there is a plurality of graphs illustrating electrical characteristics of an exemplary gate driver system, such as gate driver system 100, while turning off a primary switch. Each of the plurality of graphs depict a period of time between 23 and 30 microseconds. At 25 microseconds, the process of turning off the primary switch begins. At 27 microseconds, controller 170 responds to determining the magnitude of the negative gate voltage exceeds the magnitude of the negative voltage of rail 143 by turning off switch 145b and turning on switch 145d.

Figure 6A:
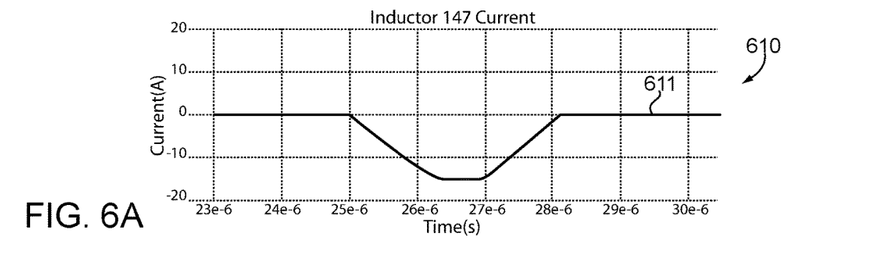
Figure 6B:
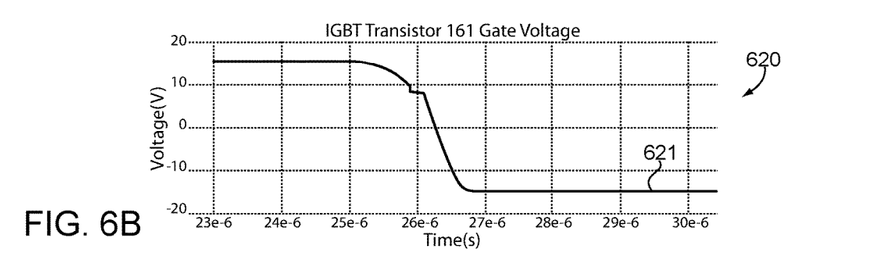
Figure 6C:
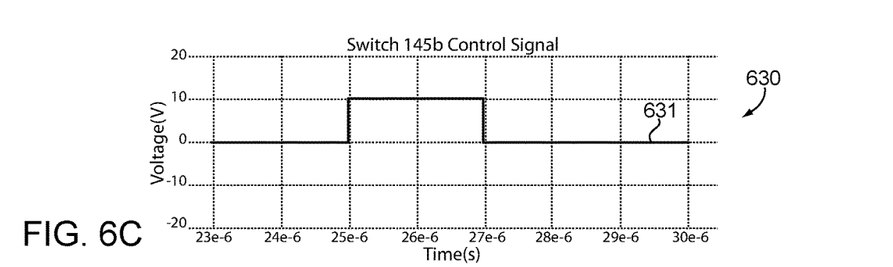
Figure 6D:
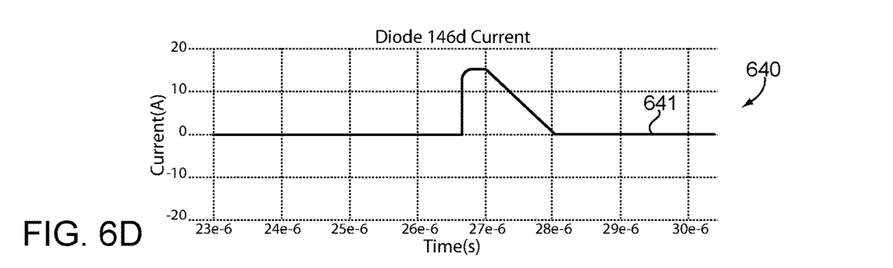
Figure 6E:
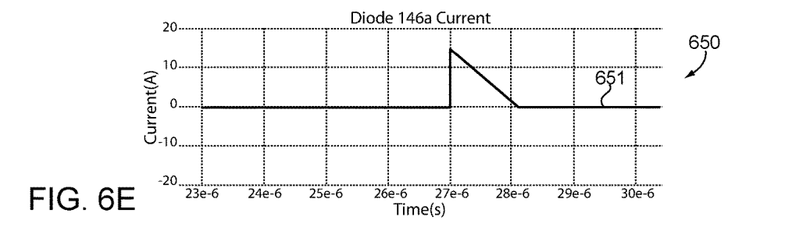

FIG. 6A is a graph including a line 611 representing current flowing through inductor 147. FIG. 6B is a graph including a line 621 representing voltage at the gate of IGBT transistor 161. FIG. 6C is a graph including a line 631 representing a control signal transmitted from controller 170 to switch 145b. FIG. 6D is a graph including a line 641 representing current flowing through diode 146d. FIG. 6E is a graph including a line 651 representing current flowing through diode 146a.

Figure 7:
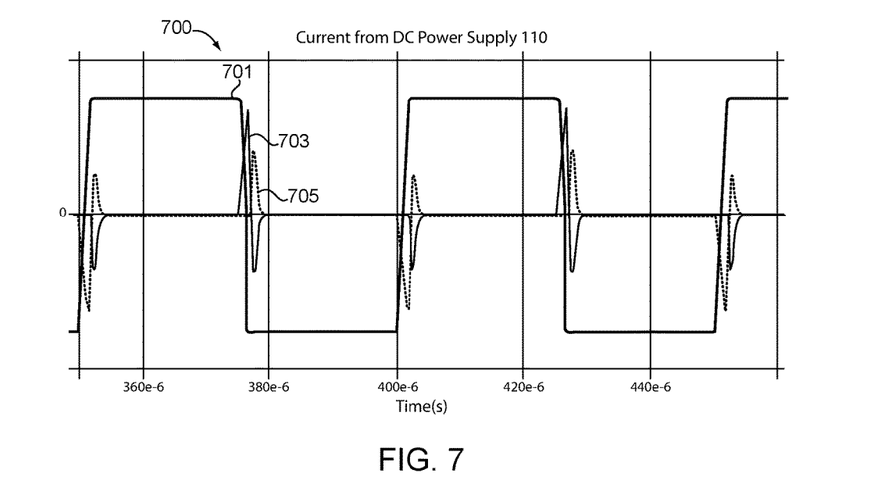

With reference to FIG. 7 there is a graph 700 illustrating power flow through an exemplary gate driver system, such as gate driver system 100, during gate driver operation. Graph 700 includes a line 701 representing voltage at the gate of IGBT gate transistor 161. Graph 700 also includes two lines 703, 705 representing current flow between IGBT 160 and DC power supply circuit 110. Line 703 represents current flow from negative terminus 133 to IGBT 160 and line 705 represents current flow from positive terminus 131 to IGBT 160. The portion of line 705 greater than zero indicates power returning from IGBT 160 to power supply circuit 110.

Further written description of a number of exemplary embodiments shall now be provided. One embodiment is a gate driver comprising a first DC rail structured to be coupled to a DC power supply and receive DC power with a positive voltage; a second DC rail structured to be coupled to the DC power supply and receive DC power with a negative voltage; a first converter arm coupled between the first DC rail and the second DC rail and including a first semiconductor device and second semiconductor device coupled at a first midpoint connection; a second converter arm including a third semiconductor device and a fourth semiconductor device coupled at a second midpoint connection, the second midpoint connection structured to be coupled to a gate of a primary switching device; an inductor coupled between the first midpoint connection and the second midpoint connection; and a controller configured to open and close the primary switching device by operating the first semiconductor device, the second semiconductor device, the third semiconductor device, and the fourth semiconductor device so as to transmit power between the second midpoint connection and the gate of the primary switching device, wherein the controller is configured to transmit a gate signal to the primary switching device by closing the second semiconductor device, then opening the second semiconductor device and closing the fourth semiconductor device in response to the gate of the primary switching device receiving power with a negative voltage greater than or equal in magnitude to the negative voltage of the second DC rail.

In certain forms of the foregoing driver, the controller is configured to close the primary switching device by closing the first semiconductor device, then opening the first semiconductor device and closing the third semiconductor device in response to the gate of the primary switching device receiving power with a positive voltage greater than or equal in magnitude to the positive voltage of the first DC rail. In certain forms, the driver comprises a fifth semiconductor device including a first terminus coupled to the second midpoint connection and a second terminus coupled to a ground. In certain forms, the controller is configured to open the second semiconductor device and close the fifth semiconductor device in response to determining a change in current of the power transmitted between the second midpoint connection and the gate of the primary switch exceeds a current threshold. In certain forms, the first semiconductor device includes a first terminus coupled to the first DC rail and a second terminus coupled to the first midpoint connection; the second semiconductor device includes a first terminus coupled to the first midpoint connection and a second terminus coupled to the second DC rail; the third semiconductor device includes a first terminus coupled to the first DC rail and a second terminus coupled to the second midpoint connection; and the fourth semiconductor device includes a first terminus coupled to the second midpoint connection and a second terminus coupled to the second DC rail. In certain forms, at least one semiconductor device includes a switching device and a freewheeling diode coupled in an anti-parallel configuration. In certain forms, the primary switch is an insulated-gate bipolar transistor (IGBT).

Another exemplary embodiment is a gate driver comprising a positive DC rail coupled to a DC power supply and receive DC power with a positive voltage; a negative DC rail structured to be coupled to the DC power supply and receive DC power with a negative voltage; a first converter arm coupled between the positive DC rail and the negative DC rail and including a first semiconductor device and second semiconductor device coupled at a first midpoint connection; a second converter arm including a third semiconductor device and a fourth semiconductor device coupled at a second midpoint connection, the second midpoint connection structured to be coupled to a gate of a primary switching device; an inductor coupled between the first midpoint connection and the second midpoint connection; and a controller configured to open and close the primary switching device by operating the first semiconductor device, the second semiconductor device, the third semiconductor device, and the fourth semiconductor device so as to transmit power between the second midpoint connection and the gate of the primary switching device, wherein the controller is configured to transmit a gate signal to the primary switching device by closing the first semiconductor device, then opening the first semiconductor device and closing the third semiconductor device in response to the gate of the primary switching device receiving power with a positive voltage greater than or equal in magnitude to the positive voltage of the first DC rail.

In certain forms of the foregoing driver, the controller is configured to open the primary switching device by closing the second semiconductor device, then opening the second semiconductor device and closing the fourth semiconductor device in response to the gate of the primary switching device receiving power with a negative voltage greater than or equal in magnitude to the negative voltage of the negative DC rail. In certain forms, the gate driver comprises a fifth semiconductor device coupled to the second midpoint connection, wherein the controller is configured to open the primary switching device by closing the fifth semiconductor device in response to detecting a change in current of the power transmitted between the second midpoint connection and the gate of the primary switching device exceeds a current threshold. In certain forms, the controller includes a driver integrated circuit, a digital logic circuit structured to transmit a feedback signal and one control signal for each semiconductor device, and a field-programmable gate array (FPGA) structured to receive a modulation signal and the feedback signal, generate at least one FPGA signal using the modulation signal configured to close the second semiconductor device, and generate at least one FPGA signal using the feedback signal and modulation signal configured to open the second semiconductor device. In certain forms, the digital logic circuit includes a comparator structured to receive a first input signal corresponding to the voltage of the gate of the primary switching device, receive a second input signal corresponding to the voltage of the first DC rail, and output the feedback signal in response to receiving the first input signal and the second input signal. In certain forms, the gate driver comprises a capacitor coupled to the gate of the primary switching device. In certain forms, the gate driver, comprises a DC power supply including a transformer, the power supply structured to receive AC power, convert the AC power to DC power, and output the DC power to the first DC rail and the negative DC rail. In certain forms, the inductor is a coreless PCB inductor.

A further exemplary embodiment is a method for driving a primary switch comprising operating a first converter leg and a second converter leg across a DC bus, the first converter leg including a first semiconductor switch and a second semiconductor switch coupled at a first midpoint connection, the second converter leg including a third semiconductor switch and a fourth semiconductor switch coupled at a second midpoint connection, a first midpoint connection and the second midpoint coupled by way of an inductor, and the second midpoint connection being coupled to the primary switch; receiving a modulating signal corresponding to a duty cycle for operation of the primary switch; closing the first semiconductor switch in response to the modulating signal; comparing a first electrical characteristic of a gate of the primary switch with a second electrical characteristic of the DC bus; opening the first semiconductor switch and closing the third semiconductor switch in response to comparing the first electrical characteristic with the second electrical characteristic; opening the third semiconductor switch and closing the second semiconductor switch in response to the modulating signal; comparing a third electrical characteristic of the gate of the primary switch with a fourth electrical characteristic of the DC bus; and opening the second semiconductor switch and closing the fourth semiconductor switch in response to comparing the third electrical characteristic with fourth electrical characteristic.

In certain forms of the foregoing method, the first electrical characteristic and the second electrical characteristic are positive voltage, and the third electrical characteristic and the fourth electrical characteristic are negative voltage. In certain forms, comparing the first electrical characteristic with the second electrical characteristic includes determining a magnitude of the first electrical characteristic is greater than a magnitude of the second electrical characteristic. In certain forms, the method comprises coupling a fifth semiconductor switch between the second midpoint connection and a ground, determining a change in current occurring at the second midpoint connection exceeds a threshold value, and closing the fifth semiconductor switch in response to determining a change in current occurring at the second midpoint connection exceeds a threshold value. In certain forms, the modulating signal is generated using space vector modulation.

It is contemplated that the various aspects, features, processes, and operations from the various embodiments may be used in any of the other embodiments unless expressly stated to the contrary. Certain operations illustrated may be implemented by a computer executing a computer program product on a non-transient computer readable storage medium, where the computer program product includes instructions causing the computer to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described and that all changes and modifications that come within the spirit of the present disclosure are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with or a connection to another item as well as a belonging to or a connection with the other item as informed by the context in which it is used. The terms "coupled to," "coupled with" and the like include indirect connection and coupling and further include but do not require a direct coupling or connection unless expressly indicated to the contrary. When the language "at least a portion" and/or "a portion" is used the item can include a portion and/or the entire item unless specifically stated to the contrary.

What is claimed is:

1. A gate driver comprising:
    a first DC rail structured to be coupled to a DC power supply and receive DC power with a positive voltage;
    a second DC rail structured to be coupled to the DC power supply and receive DC power with a negative voltage;
    a first converter arm coupled between the first DC rail and the second DC rail and including a first semiconductor device and second semiconductor device coupled at a first midpoint connection;
    a second converter arm including a third semiconductor device and a fourth semiconductor device coupled at a second midpoint connection, the second midpoint connection structured to be coupled to a gate of a primary switching device;
    a fifth semiconductor device including a first terminus coupled to the second midpoint connection and a second terminus coupled to a ground;
    an inductor coupled between the first midpoint connection and the second midpoint connection; and
    a controller configured to open and close the primary switching device by operating the first semiconductor device, the second semiconductor device, the third semiconductor device, and the fourth semiconductor device so as to transmit power between the second midpoint connection and the gate of the primary switching device,
    wherein the controller is configured to transmit a gate signal to the primary switching device by closing the second semiconductor device, then opening the second semiconductor device and closing the fourth semiconductor device in response to the gate of the primary switching device receiving power with a negative voltage greater than or equal in magnitude to the negative voltage of the second DC rail.

2. The gate driver of claim 1 wherein the controller is configured to close the primary switching device by closing the first semiconductor device, then opening the first semiconductor device and closing the third semiconductor device in response to the gate of the primary switching device receiving power with a positive voltage greater than or equal in magnitude to the positive voltage of the first DC rail.

3. The gate driver of claim 1 wherein the controller is configured to open the second semiconductor device and close the fifth semiconductor device in response to determining a change in current of the power transmitted between the second midpoint connection and the gate of the primary switch exceeds a current threshold.

4. The gate driver of claim 1 wherein the first semiconductor device includes a first terminus coupled to the first DC rail and a second terminus coupled to the first midpoint connection; the second semiconductor device includes a first terminus coupled to the first midpoint connection and a second terminus coupled to the second DC rail; the third semiconductor device includes a first terminus coupled to the first DC rail and a second terminus coupled to the second midpoint connection; and the fourth semiconductor device includes a first terminus coupled to the second midpoint connection and a second terminus coupled to the second DC rail.

5. The gate driver of claim 1 wherein at least one semiconductor device includes a switching device and a freewheeling diode coupled in an anti-parallel configuration.

6. The gate driver of claim 1 wherein the primary switch is an insulated-gate bipolar transistor (IGBT).

7. A method for driving a primary switch comprising:
operating a first converter leg and a second converter leg across a DC bus, the first converter leg including a first semiconductor switch and a second semiconductor switch coupled at a first midpoint connection, the second converter leg including a third semiconductor switch and a fourth semiconductor switch coupled at a second midpoint connection, a first midpoint connection and the second midpoint coupled by way of an inductor, and the second midpoint connection being coupled to the primary switch;
receiving a modulating signal corresponding to a duty cycle for operation of the primary switch;
closing the first semiconductor switch in response to the modulating signal;
comparing a first electrical characteristic of a gate of the primary switch with a second electrical characteristic of the DC bus;
opening the first semiconductor switch and closing the third semiconductor switch in response to comparing the first electrical characteristic with the second electrical characteristic;
opening the third semiconductor switch and closing the second semiconductor switch in response to the modulating signal;
comparing a third electrical characteristic of the gate of the primary switch with a fourth electrical characteristic of the DC bus; and
opening the second semiconductor switch and closing the fourth semiconductor switch in response to comparing the third electrical characteristic with fourth electrical characteristic;
wherein the modulating signal is generated using space vector modulation.

8. The method of claim 7 wherein the first electrical characteristic and the second electrical characteristic are positive voltage, and the third electrical characteristic and the fourth electrical characteristic are negative voltage.

9. The method of claim 8 wherein comparing the first electrical characteristic with the second electrical characteristic includes determining a magnitude of the first electrical characteristic is greater than a magnitude of the second electrical characteristic.

10. The method of claim 7 comprising:
coupling a fifth semiconductor switch between the second midpoint connection and a ground,
determining a change in current occurring at the second midpoint connection exceeds a threshold value, and
closing the fifth semiconductor switch in response to determining a change in current occurring at the second midpoint connection exceeds a threshold value.

11. A gate driver comprising:
a first DC rail structured to be coupled to a DC power supply and receive DC power with a positive voltage;
a second DC rail structured to be coupled to the DC power supply and receive DC power with a negative voltage;
a first converter arm coupled between the first DC rail and the second DC rail and including a first semiconductor device and second semiconductor device coupled at a first midpoint connection;
a second converter arm including a third semiconductor device and a fourth semiconductor device coupled at a second midpoint connection, the second midpoint connection structured to be coupled to a gate of a primary switching device;
an inductor coupled between the first midpoint connection and the second midpoint connection; and
a controller configured to open and close the primary switching device by operating the first semiconductor device, the second semiconductor device, the third semiconductor device, and the fourth semiconductor device so as to transmit power between the second midpoint connection and the gate of the primary switching device,
wherein the controller is configured to turn on the primary switching device by first closing the first semiconductor device while the fourth semiconductor device is open to concurrently provide a current to the inductor and increase a voltage of the gate of the primary switching device and once the voltage of the gate exceeds a voltage of the first rail opening the first semiconductor device semiconductor device and closing the third semiconductor device.

12. The gate driver of claim 11 wherein the controller is configured to transmit a gate signal to the primary switching device by closing the second semiconductor device, then opening the second semiconductor device and closing the fourth semiconductor device in response to the gate of the primary switching device receiving power with a negative voltage greater than or equal in magnitude to the negative voltage of the second DC rail.

13. The gate driver of claim 11 comprising a fifth semiconductor device including a first terminus coupled to the second midpoint connection and a second terminus coupled to a ground.

14. The gate driver of claim 13 wherein the controller is configured to open the second semiconductor device and close the fifth semiconductor device in response to determining a change in current of the power transmitted between the second midpoint connection and the gate of the primary switch exceeds a current threshold.

15. The gate driver of claim 11 wherein the first semiconductor device includes a first terminus coupled to the first DC rail and a second terminus coupled to the first midpoint connection; the second semiconductor device includes a first terminus coupled to the first midpoint connection and a second terminus coupled to the second DC rail; the third semiconductor device includes a first terminus coupled to the first DC rail and a second terminus coupled to the second midpoint connection; and the fourth semiconductor device includes a first terminus coupled to the second midpoint connection and a second terminus coupled to the second DC rail.

16. The gate driver of claim 11 wherein at least one semiconductor device includes a switching device and a freewheeling diode coupled in an anti-parallel configuration.

17. The gate driver of claim 11 wherein the primary switch is an insulated-gate bipolar transistor (IGBT).

18. The gate driver of claim 11 comprising a DC power supply including a transformer, the power supply structured to receive AC power, convert the AC power to DC power, and output the DC power to the first DC rail and the SECOND DC rail.

19. The gate driver of claim 11 wherein the inductor is a coreless PCB inductor.

* * * * *